United States Patent [19]

Ruegg

[11] 3,972,006
[45] July 27, 1976

[54] BANDPASS FILTER
[75] Inventor: Frank A. Ruegg, Brea, Calif.
[73] Assignee: Beckman Instruments, Inc., Fullerton, Calif.
[22] Filed: Sept. 20, 1974
[21] Appl. No.: 507,687

[52] U.S. Cl. ................................. 330/107; 330/85; 330/108
[51] Int. Cl.² .......................................... H03F 1/36
[58] Field of Search ................. 330/9, 85, 107, 108, 330/109

[56] References Cited
UNITED STATES PATENTS
3,633,043   1/1972   Anthony ........................... 330/85 X Primary Examiner—R. V. Rolinec
Assistant Examiner—Lawrence J. Dahl
Attorney, Agent, or Firm—R. J. Steinmeyer; F. L. Mehlhoff

[57] ABSTRACT

An active filter for electronic circuits comprising a single frequency bandpass filter including two stages each comprising a differential input high performance operational amplifier with the output of a second stage being connected in feedback relationship to one input of the first stage and the output of the first stage being interconnected with one input of the second stage. The output of the filter circuit is taken from the output of the first stage of the amplifier and the input to the filter circuit is the negative input of the first stage of the amplifier.

2 Claims, 2 Drawing Figures

BANDPASS FILTER

BACKGROUND OF THE INVENTION

The present invention relates to active filter circuits, and more particularly to an improved pretuned single frequency bandpass filter utilizing two stages, each comprised of a differential input high performance operational amplifier.

It is well known in the micro-electronic arts, and particularly in the thick film art, that micro-electronic circuits are well adapted for construction of miniature modular devices such as audio bandpass filters. Several filter designs have been widely publicized in the past, for example, see "Operational Amplifiers" by Burr-Brown, published by McGraw-Hill. In general, in construction of such micro-electronic filters, the filter is comprised of an assemblage of resistive and capacitive elements formed on a substrate and interconnected with one or more stages each comprising a differential amplifier, such as a high performance operational amplifier. For example, integrated circuit integrated operational amplifiers similar to Fairchild Camera and Instrument Model $\mu$A741 are commonly utilized.

Various filter designs which utilize a single amplifier of the above-mentioned type have been suggested in the prior art. However, such single stage amplifiers usually manifest certain disadvantages in construction and use. For example, the filters commonly exhibit a pronounced sensitivity to the host circuit parameters. In addition, the Q of the filter comprising such an amplifier and the center frequency are usually interdependent, which is an undesirable relationship. Finally, the capacitive elements of the filter circuit may require matching for proper operation, i.e., with respect to twin T forms, for example, matching of three capacitors is required.

The disadvantages mentioned above in connection with single-stage amplifier type filters are usually avoided in more complex amplifier designs, for example in filters which employ three amplifier stages in a "state variable" or "biquad" configuration. These more complex circuits are, however, obviously more expensive to produce and hence are not as well suited for widespread use in simpler circuits.

SUMMARY OF THE INVENTION

Accordingly, it is an object of the invention to provide a new and improved filter circuit which overcomes the disadvantages of the prior art circuits mentioned hereinbefore.

It is a further object of the invention to provide a frequency selective filter circuit which is economical to produce and well suited to high volume production.

It is yet another object of the invention to provide a frequency selective filter circuit which utilizes two amplifier stages and is better suited for manufacture in micro-electronic form than prior art devices.

It is a further object of the invention to provide a frequency selective filter circuit that requires only two amplifiers and generally overcomes the disadvantages of sensitivity, frequency dependency and capacitive matching which exist with respect to single-stage filters.

BRIEF DESCRIPTION OF THE DRAWINGS

Other objects and features of the invention will become apparent when considered with the following detailed description of the invention taken in conjunction with the accompanying drawings wherein.

DETAILED DESCRIPTION OF THE INVENTION

Figure 1:
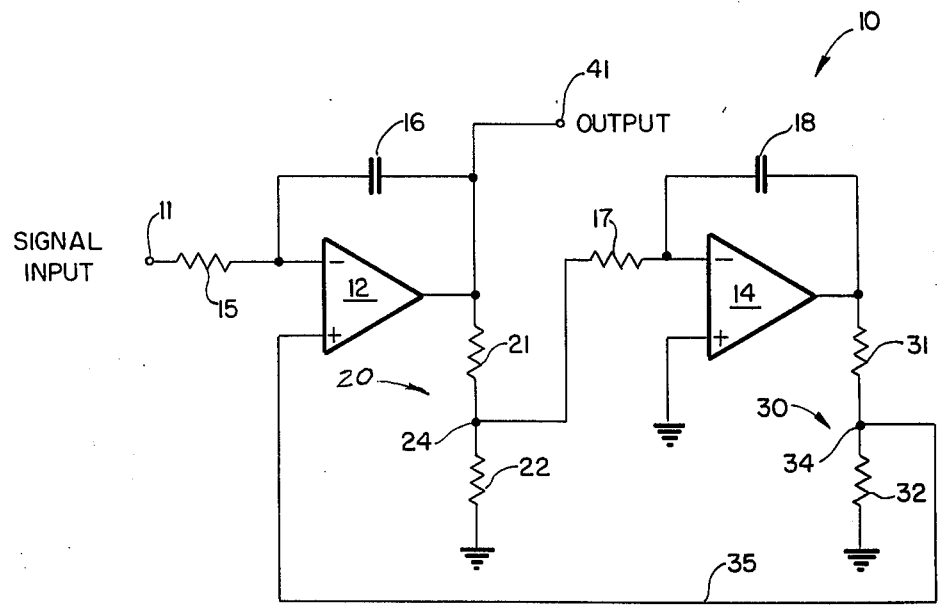
FIG. 1 is an electrical schematic diagram of a frequency selective filter circuit incorporating two amplifier stages, each comprising a high performance operational amplifier.

Referring now to FIG. 1, a frequency selective filter circuit 10 is illustrated including two stages comprised of active elements 12, 14, respectively. In the embodiment illustrated, the active elements comprise differential input high performance operational amplifiers, such as those available from Fairchild Camera and Instrument, designated as Model $\mu$A741. However, it should be recognized that any other type of suitable high performance operational amplifier could be utilized as well.

The operational amplifiers in question have inverting and noninverting inputs and an output. In the embodiment illustrated the inverting input of amplifier 12 is interconnected via a resistor 15 to a signal input terminal 11 of the filter. In addition, the inverting input is interconnected with the output of amplifier 12 via a capacitor 16, and the output of amplifier 12 is also connected to output terminal 14, as shown.

Also as shown, the output of amplifier 12 is interconnected through a voltage divider network comprising resistors 21, 22 to ground with the common juncture 24 of the resistor network being interconnected via a resistor 17 to the inverting input of amplifier 14. The inverting input of amplifier 14 is also interconnected, via capacitor 18 to the output of amplifier 14. The output of amplifier 14 is interconnected via a resistor divider network comprising resistors 31, 32 to ground, and the noninverting input of amplifier 14 is connected to ground.

The common juncture 34 of the later resistor network is interconnected via conductor 35 with the noninverting input of amplifier 12 to comprise a feedback circuit.

With reference to FIG. 1, where voltage divider 20 is comprised of resistors 21, 22 and voltage divider 30 is comprised of resistors 31, 32, the ratio of $R_{21} + R_{22}$ to $R_{22}$ is considered as K1. In similar fashion, the ratio of $R_{31} + R_{32}$ to $R_{32}$ is considered as K2. Given these relationships then the ratio of $E_{out}/E_{in}$ may be expressed by the transfer function shown below as equation (1) where the Q of the circuit and the center frequency, $f_o$, of the circuit are expressed as shown in equations (2) and (3) below.

$$\frac{E_{out}}{E_{in}} = - \frac{K_1 K_2 R_{17} C_{18} S}{K_1 K_2 R_{15} C_{16} R_{17} C_{18} S^2 + R_{15} C_{16} S + 1} \quad (1)$$

$$\text{Where } Q = \sqrt{K_1 K_2} \cdot \sqrt{\frac{R_{17} C_{18}}{R_{15} C_{16}}} \quad (2)$$

$$\text{and } f_o = \frac{1}{2\pi} \sqrt{\frac{1}{K_1 K_2 R_{15} R_{17} C_{16} C_{18}}} \quad (3)$$

In similar fashion the gain at center frequency is that expressed below as equation (4).

$$\text{gain at center frequency} = -K_1 K_2 \frac{R_{17} C_{18}}{R_{15} C_{16}} = -Q^2 \quad (4)$$

If the above equations are examined, a number of advantageous characteristics of the present circuit become apparent. For example, if the product of $R_{17}C_{18}$ equals or nearly equals the product of $R_{15}C_{16}$, then the Q of the circuit is determined solely by the divider ratios. ($K_1$ can be made equal to $K_2$ for design simplicity.) This means that Q can be selected independent of the actual values of the resistors and capacitors. This is particularly important where active tuning of the center filter is performed by varying both resistors.

In addition, the center frequency $f_o$ is lowered by a factor $\sqrt{K_1K_2}$ over conventional RC filters. This can allow a significant reduction in component size over types of filters where the output frequency is necessarily directly related to the product of resistance capacitance of the circuit. This, again, is a very important consideration in miniaturizing the circuit for utilization in thick film micro-electronic technology since smaller parts give smaller size and lower cost.

Finally, both the Q and output frequency equations have first order RC dependency, and as a result the component sensitivities of the circuit are reduced to a level comparable with the best known other types of filter configurations. Due to this relationship the initial accuracy and the stability of the circuit with respect to time and temperature are also improved.

Finally, with the configuration shown the center band gain is equal to $Q^2$. Consequently, for medium and higher Q figures, this allows significant circuit gain to be attained. If a lower gain is desired, a simple L attenuator can be added to reduce gain.

Figure 2:
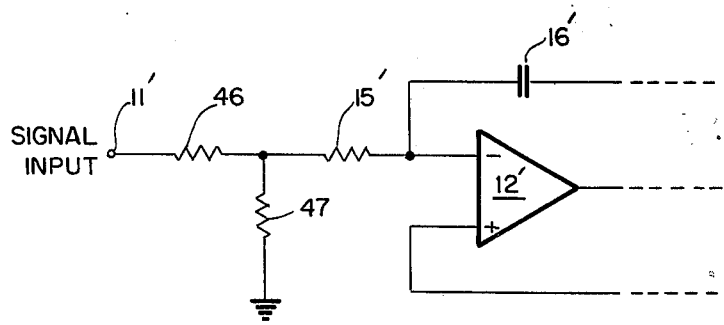
FIG. 2 is an electrical schematic diagram of an alternative embodiment of the invention illustrated in FIG. 1.

For example, FIG. 2 illustrates such an attenuator consisting of resistors 46, 47 interconnected to the signal input terminal. The other elements of FIG. 2 all represent corresponding elements of FIG. 1 and are designated by like primed numerals.

The addition of the attenuator as illustrated in FIG. 2 reduces the tuning dependency upon signal source impedance over that present in the circuit of FIG. 1, but the equivalent resistance of $R_{46}$ in parallel with $R_{47}$ is otherwise considered as part of $R_{15}$.

It is envisioned that the preferred embodiment of the present circuit will be fabricated according to conventional thick film micro-electronic techniques. In this art, film type resistors are deposited upon a rigid substrate such as a ceramic or glass substrate by conventional methods such as silk screening. Following an appropriate heat treatment to solidify and harden the material the resistors are then trimmed, such as by laser trimming, to adjust their resistance values to desired predetermined levels. Trimming refers to a process for selectively reducing a cross-sectional area of a component of the resistor in order to obtain a measured increase in its total resistance.

A typical trimming sequence for producing a filter illustrated in FIG. 1 might include a series of steps as set forth below. First, after screening and firing of the circuit component, each resistive divider 20, 30 is ratio trimmed to the desired Q value. Following that operation, resistors $R_{15}$, $R_{17}$ could be trimmed to 10% below design value. The remaining components, including capacitors $C_{16}$, $C_{18}$ with inherent 10% tolerance, are then assembled and the device is tested for gross performance. The second stage 14 is adjusted by actively trimming $R_{17}$ to produce unity gain from filter output 41 to amplifier 14 output with a signal of the design center frequency applied to the filter input terminal 11. Finally, the filter is tuned to center frequency by further trimming $R_{15}$ until a 180° phase shift is attained between the input and output signal as a final indication of correct tuning.

It should be apparent that the circuit fabricated in accordance with the above design and outline manufacturing steps will produce a single frequency bandpass filter having two stages, which produces outstanding filter capability without pronounced sensitivity to the individual circuit parameters. In addition, the Q of the circuit is independent of frequency and the manufacture of the circuit does not require matching of capacitive elements thereof for proper operation.

What is claimed is:

1. A bandpass filter circuit having a signal input terminal and a signal output terminal comprising:

at least first and second differential input amplifier stages, said signal input terminal being electrically connected to one differential input of said first amplifier stage and said signal output terminal being connected to an output of said first amplifier stage, first capacitive feedback means electrically interconnected between the output of said first amplifier stage and said one differential input of said first amplifier stage, second capacitive feedback means electrically interconnected between the output of said second amplifier stage and one input of the said second amplifier stage and adapted to pass signals thereto, first adjustable resistor means interconnecting the output of said first amplifier stage to ground and second adjustable resistor means interconnecting the output of said second amplifier stage to ground, circuit means connecting the output of said second amplifier stage to a second input of said first amplifier stage through part of said second adjustable resistor means and circuit means electrically connecting said one input of said second amplifier stage to the output of said first amplifier stage via part of said first adjustable resistor means, and means connecting the second input of said second amplifier stage to ground.

2. The filter circuit of claim 1 further including attenuating means interconnected between said signal input terminal and said one input of the first amplifier stage said one input being coupled to a negative terminal of said first amplifier stage.

* * * * *